(12) United States Patent
Tsukamoto et al.

(10) Patent No.: US 8,558,363 B2
(45) Date of Patent: Oct. 15, 2013

(54) LEAD FRAME SUBSTRATE AND METHOD OF MANUFACTURING THE SAME, AND SEMICONDUCTOR DEVICE

(75) Inventors: Takehito Tsukamoto, Tokorozawa (JP); Susumu Maniwa, Kasukabe (JP); Junko Toda, Kasukabe (JP); Yasuhiro Sakai, Tamana (JP)

(73) Assignee: Toppan Printing Co., Ltd., Tokyo (JP)

( * ) Notice: Subject to any disclaimer, the term of this patent is extended or adjusted under 35 U.S.C. 154(b) by 399 days.

(21) Appl. No.: 13/064,205

(22) Filed: Mar. 10, 2011

(65) Prior Publication Data
US 2011/0163435 A1     Jul. 7, 2011

Related U.S. Application Data

(63) Continuation of application No. PCT/JP2009/005041, filed on Sep. 30, 2009.

(30) Foreign Application Priority Data

Sep. 30, 2008 (JP) ................... P2008-254312

(51) Int. Cl.
*H01L 23/495* (2006.01)
(52) U.S. Cl.
USPC ............ 257/676; 257/E23.031; 257/668; 257/692; 438/123
(58) Field of Classification Search
USPC .......... 257/E23.031, 676, 668, 692, 778, 782, 257/783, 735, 786; 438/108, 118, 123, 411, 438/461, 611, 612, 666
See application file for complete search history.

(56) References Cited

U.S. PATENT DOCUMENTS

| | | | | |
|---|---|---|---|---|
| 6,410,979 | B2 * | 6/2002 | Abe | 257/684 |
| 6,455,356 | B1 * | 9/2002 | Glenn et al. | 438/123 |
| 7,170,149 | B2 * | 1/2007 | Shirasaka et al. | 257/666 |
| 7,196,409 | B2 * | 3/2007 | Den Ouden | 257/690 |
| 7,208,817 | B2 * | 4/2007 | Ito et al. | 257/666 |
| 7,312,511 | B2 * | 12/2007 | Danno et al. | 257/503 |
| 7,339,261 | B2 * | 3/2008 | Shimanuki et al. | 257/670 |
| 7,410,834 | B2 * | 8/2008 | Fukaya et al. | 438/123 |
| 7,425,756 | B2 * | 9/2008 | Danno et al. | 257/672 |

(Continued)

FOREIGN PATENT DOCUMENTS

| | | |
|---|---|---|
| CN | 1526167 A | 9/2004 |
| JP | 09-307043 | 11/1997 |

(Continued)

OTHER PUBLICATIONS

International Search Report for PCT/JP2009/005041, mailed Nov. 17, 2009.

(Continued)

*Primary Examiner* — Chris Chu

(57) ABSTRACT

A lead frame substrate, includes: a metal plate having first and second surfaces; a semiconductor element mounting section, semiconductor element electrode connection terminals, and a first outer frame section formed on the first surface; external connection terminals formed on the second surface and electrically connected with the semiconductor element electrode connection terminals; a second outer frame section formed on the second surface; and a resin layer formed on a gap between the first outer frame and the second outer frame. Each external connection terminal buried in the resin layer has at least one projection formed on a side surface thereof throughout a side lower portion of the first surface.

3 Claims, 6 Drawing Sheets

(56) References Cited

U.S. PATENT DOCUMENTS

| | | | |
|---|---|---|---|
| 7,687,893 B2 * | 3/2010 | Smith | 257/676 |
| 7,804,159 B2 * | 9/2010 | Shimanuki | 257/666 |
| 8,008,784 B2 * | 8/2011 | Hong et al. | 257/784 |

FOREIGN PATENT DOCUMENTS

| | | |
|---|---|---|
| JP | 10-223828 | 8/1998 |
| JP | 2003-309241 | 10/2003 |
| JP | 2003-309242 | 10/2003 |
| JP | 2005-117364 | 4/2005 |
| JP | 2005-175261 | 6/2005 |

OTHER PUBLICATIONS

Chinese Office Action mailed Jan. 4, 2013 in corresponding Chinese Patent Application No. 200980138144.0.

* cited by examiner

LEAD FRAME SUBSTRATE AND METHOD OF MANUFACTURING THE SAME, AND SEMICONDUCTOR DEVICE

CROSS REFERENCE TO RELATED APPLICATIONS

This application is a continuation application, under 35 U.S.C. §111(a), of international application No. PCT/JP2009/005041, filed on Sep. 30, 2009, which claimed priority to Japanese Patent Application No. 2008-254312, filed on Sep. 30, 2008, the disclosures of which are incorporated herein by reference.

TECHNICAL FIELD

The present invention relates to a semiconductor package substrate suitable for mounting a semiconductor element, and a semiconductor device, and more particularly to a lead frame substrate and a method of manufacturing the same, and a semiconductor device using the lead frame substrate and the method of manufacturing the same.

BACKGROUND ART

In semiconductor packages using a lead frame represented by a quad flat package (QFP), outer leads for connection with a printed circuit board are disposed on side surfaces of the semiconductor package.

Such a lead frame is allowed to obtain a semiconductor element mounting section, inner leads acting as sections for connection with semiconductor element electrodes, outer leads, and an outer frame section fixing them by forming predetermined photoresist patterns on both surfaces of a metal plate and etching the both surfaces of the metal plate. Further, these sections can be obtained by punching using a press in addition to the etching method.

In an assembly process of the semiconductor package, the semiconductor element is die-bonded onto the semiconductor element mounting section, and then the electrodes of the semiconductor element are electrically connected with the inner leads using, for instance, gold wires. Afterwards, the surroundings of the semiconductor element including the inner leads are encapsulated with a resin, and the outer frame section is cut off. If necessary, the outer leads are bent.

In this way, the outer leads disposed on the side surfaces are limited to a range from 200 to 300 pins in a package size of about 30 mm$^2$ from the viewpoint of a processing ability of miniaturization.

In recent years, as the number of electrodes of the semiconductor element increases, a lead frame type semiconductor package having outer leads on side surfaces thereof cannot have a terminal number corresponding to the electrode number. Some external connection terminals of, for example, a ball grid array (BGA) type or a land grid array (LGA) type for connection with a printed circuit board are replaced by a semiconductor package disposed in an array shape on a bottom surface of a package substrate.

The substrates used for these packages are generally configured to drill holes through a glass epoxy substrate having copper bonded on both surfaces thereof, bring a wall of each hole into conduction by means of plating, and form terminals for connection with the electrodes of the semiconductor element on one of the surfaces and external connection terminals arranged in an array shape on the other surface.

However, the manufacturing of the substrates requires a complicated process as well as a high cost, and provides low reliability compared to the lead frame type package because the plating is used to connect interconnections within the substrate.

For this reason, a BGA type semiconductor package structure using a lead frame, in which a process of etching the lead frame from both surfaces is used, is disclosed (e.g., Patent Document 1).

In this structure, connection terminals for semiconductor element electrode are formed on one surface and external connection terminals are formed in an array form on the other surface by changing two photoresist patterns and etching the patterns at the same time or by etching one of the photoresist patterns, coating a pre-mold resin on the etched surface, and then etching the other photoresist pattern.

Patent Document 1: Japanese Patent No. 3642911

DISCLOSURE OF INVENTION

Problem to be Solved by the Invention

FIGS. 5A and 5B are cross-sectional views showing a conventional lead frame substrate.

In a BGA type lead frame, when the number of external connection terminals 111 increases, an interconnection 110 on the side of each semiconductor element electrode connection terminal 109 is lengthened. Since this interconnection is formed by half-etching a metal plate, it has a narrow width as well as a thin thickness. Thus, the interconnection is broken or bent in the processes following the etching, so that the yield is greatly reduced.

In contrast, it is disclosed, for instance, in Patent Document 1 that, first, half-etching is performed only on the side of the external connection terminals 111, an electrodeposited polyimide layer 119 is formed on the etched surface, and the side of the semiconductor element electrode connection terminals 109 is etched so that the lead frame substrate is formed. Thereby, although the fine interconnections 110 are thin films, the fine interconnections 110 are supported by the polyimide layer 119, so that the interconnections are prevented from being broken or bent when the lead frame is manufactured.

However, according to Patent Document 1, when the semiconductor element is mounted on the lead frame substrate having this structure and then is connected with the semiconductor element electrode connection terminals 109 by wire bonding, a wire connecting force is not applied because each connection terminal 109 has a hollow lower portion, and connection failures take place. Thus, an assembly yield is remarkably reduced.

Meanwhile, (although not disclosed in Patent Document 1), another countermeasure of thickening a resin layer by potting a pre-mold resin instead of the electrodeposited polyimide layer is also taken into consideration. This countermeasure is expected to prevent the problem with bonding failure to some extent. However, it is very difficult to adjust an amount of coating, and it is impossible to entirely avoid the hollow state.

For this reason, when the pre-mold resin is coated on a second surface at a constant amount using printing technology, the resin layer is formed to a relatively uniform thickness. Although the resin layer is formed on the external connection terminals, it is also inferred that a removal process becomes easy due to a uniform film thickness.

However, in the conventional structure of the external connection terminals (FIGS. 6A and 6B are a top view and a cross-sectional view after first etching is performed, respectively), the external connection terminal is considerably bulky as if its diameter ranges from about 200 μm to about 400 μm and its height ranges from about 100 μm to about 180 μm. Here, according to printing conditions, there is a risk of injecting air bubbles into the resin layer after printing is performed, and thus there is another risk of remarkably reducing the yield of production.

FIG. 6C shows a state of a thermally cured resin layer around an external connection terminal after printing is performed. As schematically shown in FIGS. 6A through 6C, there is a risk of air bubbles being formed over the external connection terminal in a printing direction (indicated by an arrow D1).

The present invention has been made in view of the above-described circumstances, and an object of the invention is to provide a lead frame substrate and a method of manufacturing the same, and a related semiconductor element, capable of coping well with an increase in the number of electrodes of a semiconductor element, preventing air bubbles from being entrained, providing high reliability, and performing manufacture and assembly of a semiconductor package in a stable manner.

Means for Solving the Problem

A first aspect of the present invention is a lead frame substrate, including: a metal plate having first and second surfaces; a semiconductor element mounting section, semiconductor element electrode connection terminals, and a first outer frame section formed on the first surface; external connection terminals formed on the second surface and electrically connected with the semiconductor element electrode connection terminals; a second outer frame section formed on the second surface; and a resin layer formed on a gap between the first outer frame and the second outer frame, wherein each external connection terminal buried in the resin layer has at least one projection formed on a side surface thereof throughout a side lower portion of the first surface.

A second aspect of the present invention is a method of manufacturing a lead frame substrate, the method including: forming photoresist pattern to form a semiconductor element mounting section, semiconductor element electrode connection terminals, and an outer frame section on a first surface of a metal plate; forming external connection terminals connected with the semiconductor element electrode connection terminals and an outer frame section on a second surface of the metal plate; forming one or more protrusion-shaped patterns, the photoresist pattern to form the external connection terminals including the protrusion-shaped, patterns; forming, through etching, non-through holes in a metal plate exposing section in which the metal plate of the second surface is exposed; coating a liquid pre-mold resin in the holes from the external connection terminals toward a direction of a projection, and heating and curing the pre-mold resin to form a resin layer; and etching the first surface to form the semiconductor element mounting section, the semiconductor element electrode connection terminals electrically connected with the external connection terminals, and the outer frame section.

A third aspect of the present invention is a semiconductor device including: a lead frame substrate including a metal plate having first and second surfaces, a semiconductor element mounting section, semiconductor element electrode connection terminals, and a first outer frame section which are formed on the first surface, external connection terminals formed on the second surface and electrically connected with the semiconductor element electrode connection terminals, a second outer frame section formed on the second surface, and a resin layer formed on a gap between the first outer frame and the second outer frame, wherein each external connection terminal buried in the resin layer has at least one projection formed on a side surface thereof throughout a side lower portion of the first surface, wherein a semiconductor element is mounted on the lead frame substrate and electrically connected with the lead frame substrate by wire bonding.

Effect of the Invention

According to the present invention, external connection terminals for connection with a printed circuit board can be disposed on the entire rear surface of a lead frame substrate in an array form, and cope with an increase in the number of pins of a semiconductor element. Further, it is possible to ensure reliability against thermal stress because of a substrate based on a lead frame and use of no plating interconnections.

Meanwhile, when the lead frame substrate is manufactured, failures such as breaking or bending of the interconnection, as well as the entrainment of air bubbles are not generated. When a wire bonding process, i.e. a semiconductor package assembly process, is performed, a lower portion of each wire-bonding connection terminal can be stabilized and connected because a pre-mold resin layer is present on the same plane as the surface of the external connection terminal.

BEST MODE FOR CARRYING OUT THE INVENTION

FIGS. 1A through 1F are schematic cross-sectional views showing a process of manufacturing a lead frame substrate.

Figure 1A:
FIG. 1A is a cross-sectional view showing an example of a method of manufacturing a lead frame substrate according to an embodiment of the present invention.
Figure 1B:
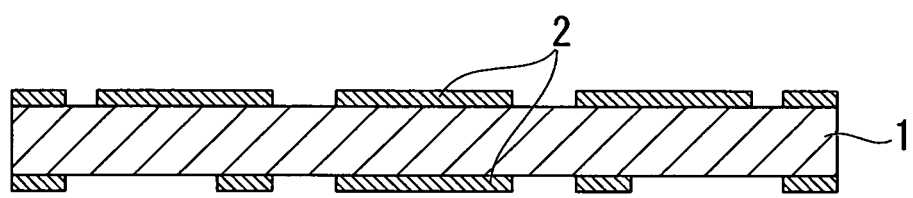
FIG. 1B is a cross-sectional view showing an example of a method of manufacturing a lead frame substrate according to the embodiment of the present invention in the process following that of FIG. 1A.

Photoresist patterns 2 are formed on both surfaces of a metal plate 1 used for a lead frame (FIG. 1B). In FIGS. 1A through 1F, a pattern for a semiconductor element mounting section 8, connection terminals 9 for semiconductor element electrodes, interconnections 10, and an outer frame section 12 is formed on an upper surface of the metal plate 1, and a pattern for external connection terminals 11 and an outer frame section is formed on a lower surface of the metal plate 1.

Figure 2A:
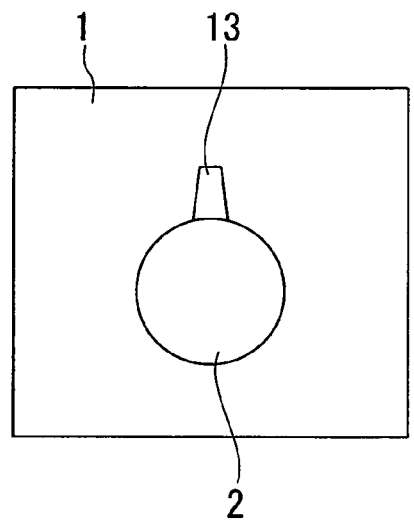
FIG. 2A is a top view showing a photoresist pattern in a lead frame substrate according to the embodiment of the present invention.

Thus, as shown in FIG. 2A, the embodiment of the present invention appropriately forms one or more protrusions 13 in addition to the external connection terminal forming pattern having a desired shape (in this case, a circular shape).

The pattern of this protrusion 13 formed of photoresist is designed so that a second metal surface is not left in subsequent etching.

The pattern of the protrusion 13 may be generally set to have a width of 30 μm or less and a length of 100 μm or less. However, because the protrusion is influenced by etching conditions of forming a hole 3 and an amount of etching, and a metal portion left behind after the etching is subjected to changes in size and shape, it is necessary to take them into consideration to optimize the size of the protrusion 13 of the photoresist pattern.

As the metal plate 1, any material may be used if it has etchability, mechanical strength, thermal conductivity, coefficient of expansion, and the like suitable for the lead frame. However, an iron-nickel alloy represented by Alloy42, a copper alloy in which a variety of metal elements are added to improve mechanical strength, or the like is often used as the metal plate 1.

Figure 1C:
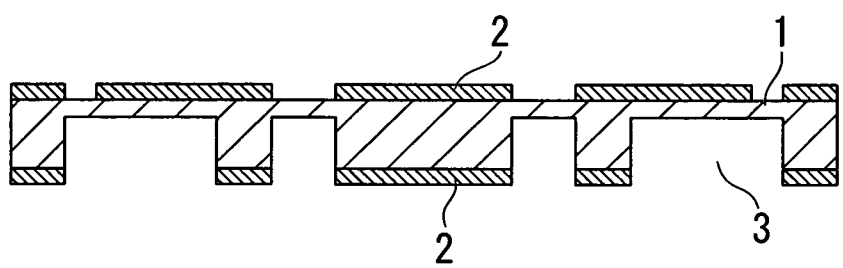
FIG. 1C is a cross-sectional view showing an example of a method of manufacturing a lead frame substrate according to the embodiment of the present invention in the process following that of FIG. 1B.

The metal plate 1 is etched from the lower surface thereof using an etching solution, such as a ferric chloride solution, which dissolves the metal plate, and thus holes 3 are formed (FIG. 1C). The holes 3 may have a depth after the holes 3 are etched with a thickness of about 10 μm to about 50 μm left such that a fine interconnection can be formed when the metal plate is subjected to second etching from the upper surface thereof, in order to allow the remainder of the metal plate to be finally formed into the interconnection.

Figure 2B:
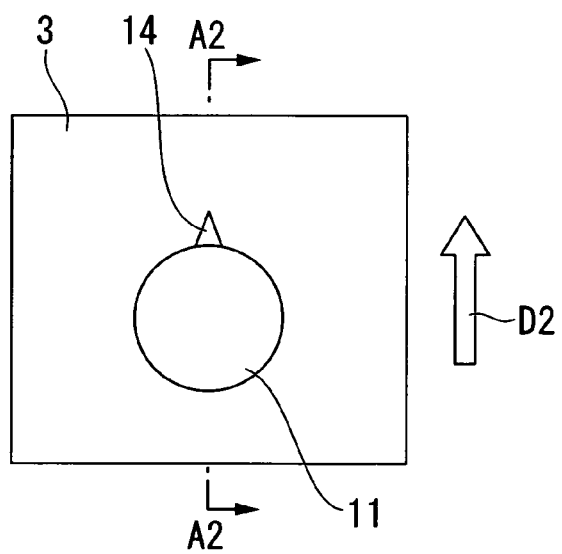
FIG. 2B is a top view after the lead frame substrate is etched according to the embodiment of the present invention.
Figure 2C:
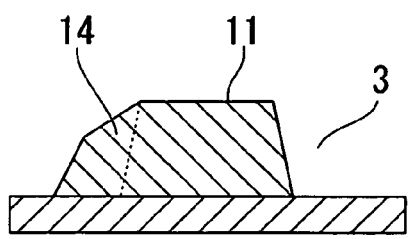
FIG. 2C is a cross-sectional view taken along line A2-A2 of FIG. 2B.

The external connection terminal is formed with at least one projection 14, as shown in FIGS. 2B and 2C.

Figure 2D:
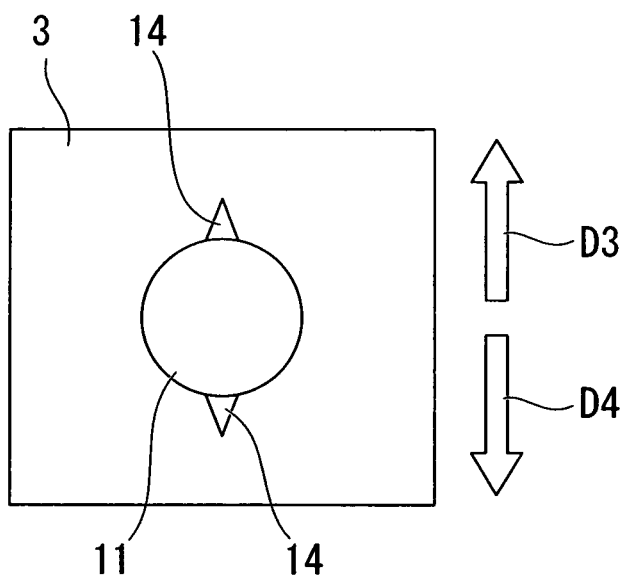
FIG. 2D is a top view after a lead frame substrate according to another embodiment of the present invention is etched.

FIG. 2C shows a cross section taken along line A2-A2 of FIG. 2B, wherein the projection 14 is formed lower than a second surface. FIG. 2B shows that one projection 14 is formed, and FIG. 2D shows that two projections 14 are formed.

Figure 1D:
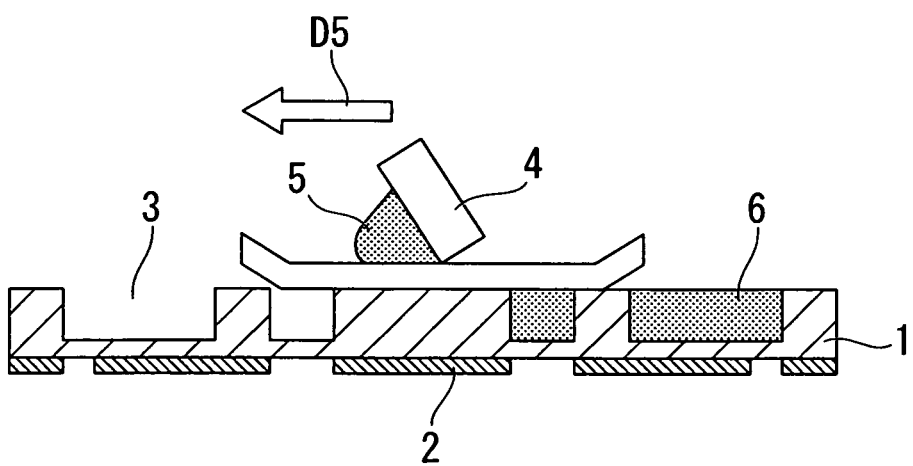
FIG. 1D is a cross-sectional view showing an example of a method of manufacturing a lead frame substrate according to the embodiment of the present invention in the process following that of FIG. 1C.

Afterwards, the etched metal plate is turned upside down, and then a liquid pre-mold resin 5 is coated on an upper surface of the metal plate in a direction of an arrow D5 (FIG. 1D).

Figure 1E:
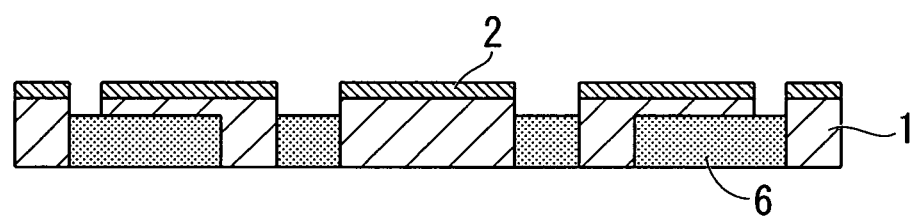
FIG. 1E is a cross-sectional view showing an example of a method of manufacturing a lead frame substrate according to the embodiment of the present invention in the process following that of FIG. 1D.

Such a coating may apply printing technology, which is generally favorable from the viewpoint of productivity and quality. As the printing method, any method in which the coating can be done at a proper thickness may be used. However, screen printing is generally favorable. A printing direction is set to a direction of an arrow D2 of FIG. 2B, an arrow D3 of FIG. 2D, or an arrow D4 of FIG. 2D. Thereby, it is possible to give directionality to a flow of the pre-mold resin and to prevent air bubbles from being entrained. After the coating is performed, the pre-mold resin is heated and cured (FIG. 1E).

After the printing coating is performed, a resin layer 6 of several microns or so is uniformly formed on the second surface (not shown). As such, it is necessary to remove this resin layer to expose the second surface. The removal method may be selected from dry etching, mechanical polishing, chemical polishing, and so on.

Figure 1F:
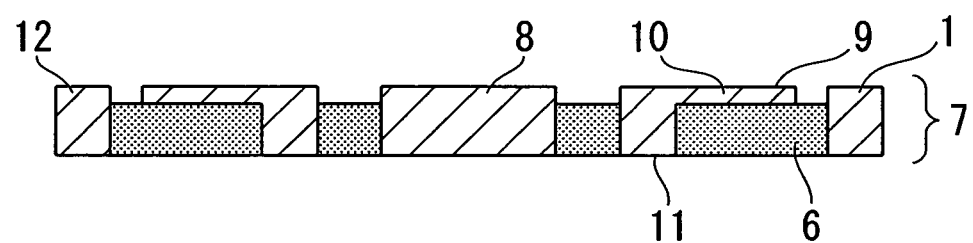
FIG. 1F is a cross-sectional view showing an example of a method of manufacturing a lead frame substrate according to the embodiment of the present invention in the process following that of FIG. 1E.
Figure 3:
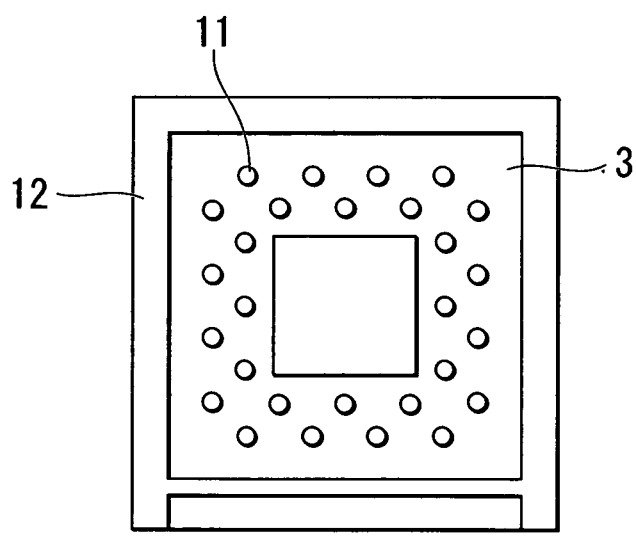
FIG. 3 is a top view showing an example of a lead frame substrate according to the embodiment of the present invention, wherein the lead frame substrate is subjected to first etching.

Furthermore, the opposite surface is etched to form the semiconductor element mounting section 8, the semiconductor element electrode connection terminals 9, and the interconnections 10. Thereby, a lead frame substrate 7 is obtained (FIG. 1F). FIG. 3 is a top view of the side of the external connection terminals. It is possible to dispose the external connection terminals in an array form, and to cope with a tendency to increase the number of pins of the semiconductor element.

Figure 4A:
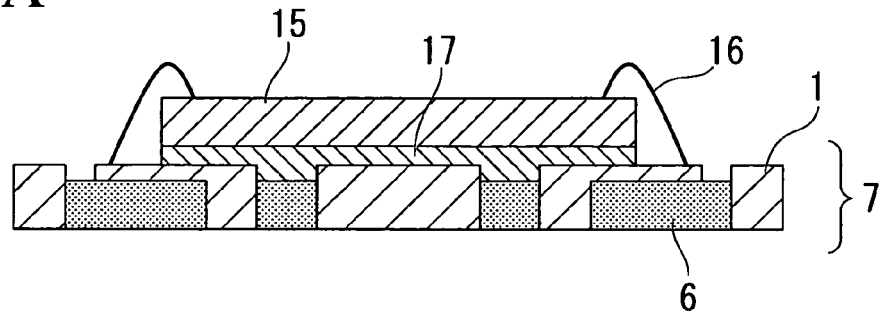
FIG. 4A is a cross-sectional view showing an example of a lead frame substrate according to the embodiment of the present invention, wherein a semiconductor element is mounted and then wire-bonded.

FIG. 4A is a cross-sectional view showing that a semiconductor element 15 is mounted and wire-bonded. The semiconductor element 15 is adhered by a die attach material 17, and is connected with the semiconductor element electrode connection terminals 9 by gold wires 16. If necessary, the semiconductor element electrode connection terminals may be properly subjected to any one of nickel-gold plating, tin plating, silver plating, nickel-palladium-gold plating, and so on.

Further, when wire bonding is performed, the lead frame substrate is placed on a heat block, and is bonded while being heated. However, the pre-mold resin below the semiconductor element electrode connection terminals 9 is present on the same plane, and a hollow structure is not provided, so that it is possible to perform assembly without causing bonding failures.

Figure 4B:
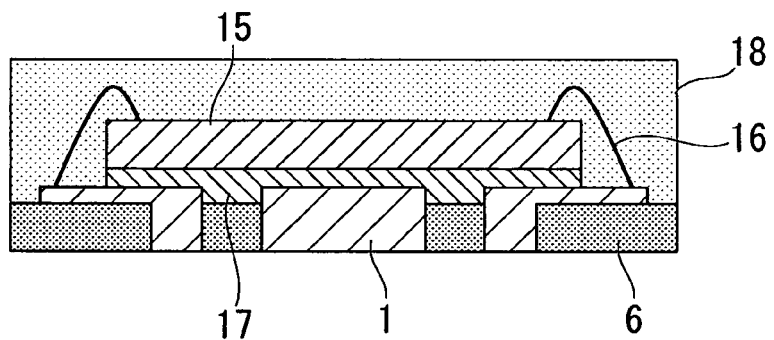
FIG. 4B is a cross-sectional view showing an example of the lead frame substrate according to the embodiment of the present invention after transfer-molding encapsulation.
Figure 5A:
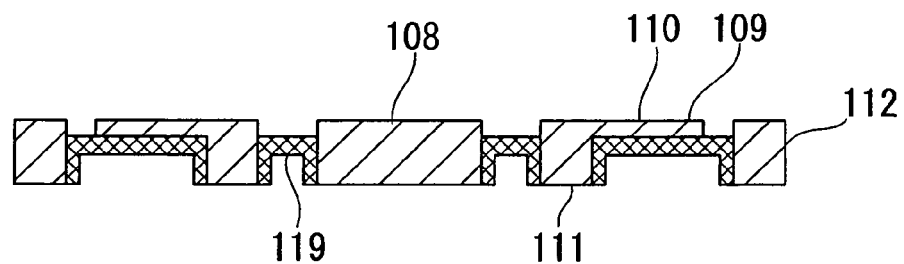
FIG. 5A is a cross-sectional view showing an example of a conventional lead frame substrate.
Figure 5B:
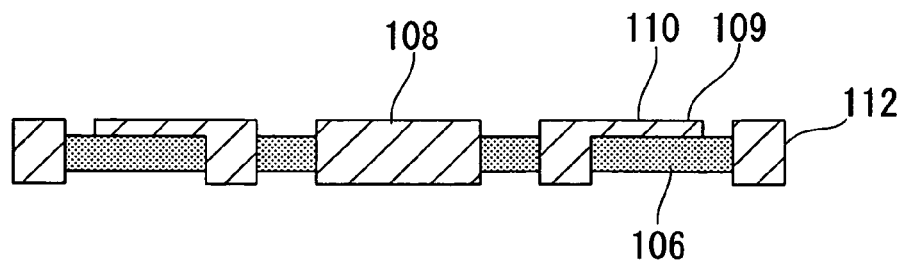
FIG. 5B is a cross-sectional view showing another example of the conventional lead frame substrate.
Figure 6A:
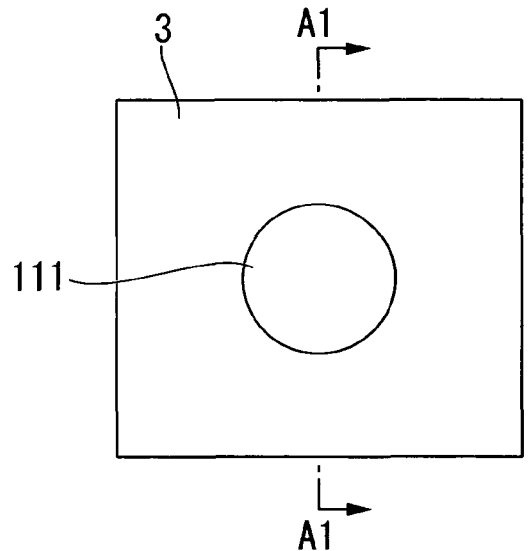
FIG. 6A is a top view showing an example of a conventional lead frame substrate after an external connection terminal is subjected to first etching.
Figure 6B:
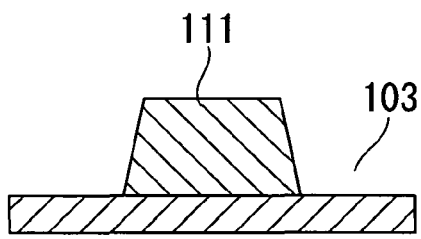
FIG. 6B is a cross-sectional view showing an example of the conventional lead frame substrate after the external connection terminal is subjected to first etching.
Figure 6C:
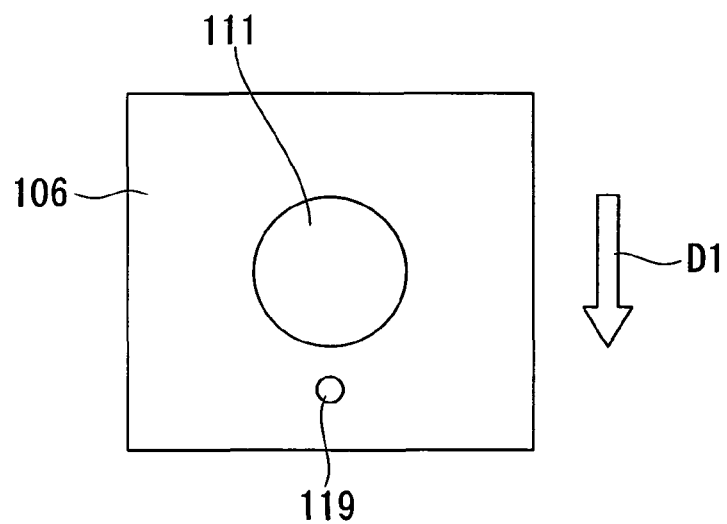
FIG. 6C is top view showing an example of the conventional lead frame substrate after the external connection terminal is subjected to first etching and then a resin layer is formed.

Finally, the side of the semiconductor element is encapsulated by transfer-molding or potting, and then the outer frame section is separated by, for instance, a diamond blade, so that the lead frame substrate is formed into a small piece (FIG. 4B).

In the case of the BGA type, solder balls are mounted on the external connection terminals, and thus the semiconductor package using the lead frame substrate is obtained.

EXAMPLE

As an example of applying an embodiment of the present invention, a ball grid array (BGA) type lead frame substrate will be described with reference to FIGS. 1A through 1F.

The manufactured BGA package has a size of 10 mm$^2$, and includes external connection terminals having an array form of 168 pins on a lower surface thereof.

First, as shown in FIG. 1A, a metal plate 1 (available from Furukawa Electric Co., Ltd., EFTEC64T), which was formed of a copper alloy and had a width of 150 mm and a thickness of 200 μm in a long strip shape, was prepared.

Next, as shown in FIG. 1B, photoresist (available from Tokyo Ohka Kogyo Co., Ltd., OFPR4000) was coated on both surfaces of the metal plate 1 by a roll coater so as to have a thickness of 5 μm, and then was pre-baked at a temperature of 90° C.

Then, pattern exposure was performed from both surfaces via a photo mask having a desired pattern. Afterwards, development was performed using a 1% aqueous sodium carbonate solution, and then water-cleaning and post-baking were performed. Thereby, photoresist patterns 2 were obtained as shown FIG. 1B.

As photoresist patterns, a pattern which forms a semiconductor element mounting section 8, semiconductor element electrode connection terminals 9, interconnections 10, and an outer frame section 12 was formed on a first surface of the metal plate, and a pattern which forms external connection terminals 11, each of which has the protrusion 13 (FIG. 2A), and an outer frame section 12 was formed on a second surface of the metal plate. Here, the protrusion 13 was shaped like an isosceles triangle which was in contact with the external connection terminal and had a width of 30 μm and a length of 80 μm.

Next, the side of the first surface of the metal plate 1 was protected by covering a back sheet (not shown). Then, first etching was performed from the second surface of the metal plate using a ferric chloride solution, and parts of the metal plate exposed from the photoresist pattern of the side of the second surface were reduced in thickness up to 30 μm (FIG. 1C).

Further, the projection 14 having a length of about 40 μm could be formed on a side surface of the external connection terminal. The used ferric chloride solution was set to have a specific gravity of 1.38 and a temperature of 50° C.

Next, screen printing coating was performed on the second surface, in which holes were formed by the first etching, using a liquid thermosetting resin (available from Shin-Etsu Chemical Co., Ltd., SMC-376KF1). The printing was performed from a place where the projection 14 was not present toward the direction of the projection (FIG. 1D).

The resin was again cured at 180° C. for 3 hours, and thus a pre-mold layer 13 was formed. The thermosetting resin was excellent in fillability, and failures including air bubbles were not observed.

Since a thermosetting resin layer of about 1 μm was left on the non-etched surfaces of the external, connection terminals 11 and the outer frame section 12, the thermosetting resin layer was processed and removed for about 3 minutes using an aqueous alkaline solution of potassium permanganate at 60° C. (potassium permanganate of 40 g/L+sodium hydroxide of 20 g/L).

Next, the back sheet was removed from the side of the first surface, and then the parts of the metal plate that were exposed from the photoresist pattern by performing second etching from the side of the first surface of the metal plate, were dissolved and removed by a ferric chloride solution. Thereby, the semiconductor element mounting section 8, the semiconductor element electrode connection terminals 9, the interconnections 10, and the outer frame section 12 were formed (FIG. 1E). The external connection terminals 11 extend from the semiconductor element electrode connection terminals 9.

Further, although not shown, a back sheet may be adhered to the side of the second surface when the second etching is performed so as to prevent unnecessary etching from being performed on the side of the lower surface.

Subsequently, the photoresist pattern 2 of the first surface was stripped, and thus a desired lead frame type BGA substrate 7 was obtained (FIG. 1F).

Next, the metal surface exposed after the stripping of the photoresist was subjected to electrolytic nickel-gold plating. Thicknesses of the nickel and gold were 5 μm and 0.1 μm, respectively (not shown).

Then, a semiconductor element 15 was mounted on the lead frame type BGA substrate 7 of the present invention using a die attach material 17, and then the die attach material was cured at 150° C. for 1 hour. Further, the electrodes of the semiconductor element and the semiconductor element electrode connection terminals 9 were connected by wire bonding using gold wires 16 having a diameter of 30 μm (FIG. 4A).

A heating temperature for the wire bonding was 200° C. An entire strength of the wires on the side of the semiconductor element electrode connection terminals was measured to be 9 g or more, and good connection was obtained.

Afterwards, as shown in FIG. 4B, an area including the semiconductor element and the semiconductor element electrode connection terminals was encapsulated by transfer-molding, and was cut into a small piece, so that the semiconductor package using the lead frame type BGA substrate was obtained.

INDUSTRIAL APPLICABILITY

A method of manufacturing a lead frame substrate of the present invention is used to be able to reduce failures in manufacture or assembly of semiconductor packages and to obtain a lead frame substrate with high reliability against thermal stress, and particularly, is applied to multi-pin package substrates that cannot be supported for a lead frame type semiconductor package.

REFERENCE SYMBOLS

1: metal plate
2: photoresist pattern
3: hole
4: squeezer
5: liquid pre-mold resin
6: resin layer
7: lead frame substrate
8: semiconductor element mounting section
9: semiconductor element electrode connection terminal
10: interconnection
11: external connection terminal
12: outer frame section
13: photoresist protrusion pattern
14: projection
15: semiconductor element
16: gold wire
17: die attach material
18: transfer-molding resin
19: air bubble

The invention claimed is:

1. A lead frame substrate, comprising:
a metal plate having first and second surfaces;
a semiconductor element mounting section, semiconductor element electrode connection terminals, and a first outer frame section formed on the first surface;
external connection terminals formed on the second surface and electrically connected with the semiconductor element electrode connection terminals;

a second outer frame section formed on the second surface; and a resin layer formed on a gap between the first outer frame section and the second outer frame section, wherein each external connection terminal buried in the resin layer has at least one projection formed on a side surface thereof, the projection being formed between a side lower portion of the external connection terminal and a side upper portion of the external connection terminal.

2. A method of manufacturing a lead frame substrate, the method comprising:

forming photoresist pattern to form a semiconductor element mounting section, semiconductor element electrode connection terminals, and an outer frame section on a first surface of a metal plate;

forming external connection terminals connected with the semiconductor element electrode connection terminals and an outer frame section on a second surface of the metal plate;

forming one or more protrusion-shaped patterns, the photoresist pattern to form the external connection terminals including the protrusion-shaped patterns;

forming, through etching, non-through holes in a metal plate exposing section in which the metal plate of the second surface is exposed;

coating a liquid pre-mold resin in the holes from the external connection terminals toward a direction of a projection, and heating and curing the pre-mold resin to form a resin layer; and etching the first surface to form the semiconductor element mounting section, the semiconductor element electrode connection terminals electrically connected with the external connection terminals, and the outer frame section.

3. A semiconductor devise, comprising:

a lead frame substrate including a metal plate having first and second surfaces, a semiconductor element mounting section, semiconductor element electrode connection terminals, and a first outer frame section which are formed on the first surface, external connection terminals formed on the second surface and electrically connected with the semiconductor element electrode connection terminals, a second outer frame section formed on the second surface, and a resin layer formed on a gap between the first outer frame section and the second outer frame section, wherein each external connection terminal buried in the resin layer has at least one projection formed on a side surface thereof the projection being formed between a side lower portion of the external connection terminal and a side upper portion of the external connection terminal, and a semiconductor element is mounted on the lead frame substrate and electrically connected with the lead frame substrate by wire bonding.

* * * * *

UNITED STATES PATENT AND TRADEMARK OFFICE
CERTIFICATE OF CORRECTION

| | | |
|---|---|---|
| PATENT NO. | : 8,558,363 B2 | Page 1 of 1 |
| APPLICATION NO. | : 13/064205 | |
| DATED | : October 15, 2013 | |
| INVENTOR(S) | : Takehito Tsukamoto et al. | |

It is certified that error appears in the above-identified patent and that said Letters Patent is hereby corrected as shown below:

In the Claims

In Column 10, Line 6, In Claim 3, delete "devise," and insert -- device, --, therefor.
In Column 10, Line 22, In Claim 3, delete "thereof" and insert -- thereof, --, therefor.

Signed and Sealed this
Twenty-fifth Day of March, 2014

Michelle K. Lee
*Deputy Director of the United States Patent and Trademark Office*